United States Patent
Brunet-Lugardon et al.

(10) Patent No.: US 11,955,967 B2
(45) Date of Patent: Apr. 9, 2024

(54) FLEXIBLE NON-MAGNETIC AND METALLIC TARGET FOR AN INDUCTIVE SENSOR

(71) Applicant: VITESCO TECHNOLOGIES GMBH, Hanover (DE)

(72) Inventors: Florian Brunet-Lugardon, Toulouse (FR); Bertrand Perillat, Toulouse (FR); Gabriel Spick, Toulouse (FR)

(73) Assignee: VITESCO TECHNOLOGIES GMBH, Hanover (DE)

( * ) Notice: Subject to any disclaimer, the term of this patent is extended or adjusted under 35 U.S.C. 154(b) by 387 days.

(21) Appl. No.: 17/413,779

(22) PCT Filed: Dec. 18, 2019

(86) PCT No.: PCT/EP2019/085970
§ 371 (c)(1),
(2) Date: Jun. 14, 2021

(87) PCT Pub. No.: WO2020/127497
PCT Pub. Date: Jun. 25, 2020

(65) Prior Publication Data
US 2022/0094361 A1 Mar. 24, 2022

(30) Foreign Application Priority Data
Dec. 18, 2018 (FR) ..................................... 1873186

(51) Int. Cl.
*H03K 17/97* (2006.01)
*E05B 81/64* (2014.01)
(Continued)

(52) U.S. Cl.
CPC ............. *H03K 17/97* (2013.01); *E05B 81/64* (2013.01); *G01L 1/044* (2013.01); *E05B 81/76* (2013.01); *H03K 2017/9706* (2013.01)

(58) Field of Classification Search
CPC ............ H03K 17/97; H03K 2017/9706; E05B 81/64; E05B 81/76; G01L 1/044
See application file for complete search history.

(56) References Cited

U.S. PATENT DOCUMENTS 9,487,974 B2 11/2016 Saitou
9,824,841 B2 * 11/2017 Tsang ................... G08B 21/187
(Continued)

FOREIGN PATENT DOCUMENTS

CN 102969180 A 3/2013
CN 104453493 A 3/2015
(Continued)

OTHER PUBLICATIONS

Office Action issued in Chinese Patent Application No. 201980083909.9 dated Dec. 2, 2021.
(Continued)

*Primary Examiner* — Christopher P McAndrew
*Assistant Examiner* — Zannatul Ferdous
(74) *Attorney, Agent, or Firm* — NIXON & VANDERHYE

(57) ABSTRACT

Disclosed is an assembly of a non-magnetic and metallic target for an inductive sensor and its support, the target being flexible under pressure and under the release of the pressure in a reciprocating movement toward and away from the support. The target includes a central portion surrounded by flexible fixing tabs, a first end of which is secured to the central portion and a second end of which is fixed to the support, the fixing tabs being evenly distributed around the central portion, a first portion of each fixing tab closest to the central portion being stiffer relative to a portion of the fixing tab farthest away from the central portion.

21 Claims, 3 Drawing Sheets

(51) Int. Cl.
   *G01L 1/04*   (2006.01)
   *E05B 81/76*   (2014.01)

(56) References Cited

U.S. PATENT DOCUMENTS

| | | |
|---|---|---|
| 10,428,562 B2 | 10/2019 | Guibbert et al. |
| 10,555,504 B2 * | 2/2020 | Sharpe .................. A01K 11/00 |
| 10,597,913 B2 | 3/2020 | Kitahara |
| 10,975,601 B2 | 4/2021 | Beck et al. |
| 2012/0167642 A1 | 7/2012 | Savant et al. |
| 2012/0330572 A1 * | 12/2012 | Longman ................ B62J 45/41 |
| | | 702/187 |
| 2019/0017302 A1 | 1/2019 | Beck et al. |
| 2019/0017303 A1 | 1/2019 | Beck et al. |
| 2021/0040782 A1 * | 2/2021 | Fontanet ................ E05B 81/77 |

FOREIGN PATENT DOCUMENTS

| | | |
|---|---|---|
| CN | 106338772 A | 1/2017 |
| DE | 103 03 706 | 4/2005 |
| DE | 10 2006 010 811 A1 | 9/2007 |
| DE | 20 2014 104 641 | 1/2016 |
| DE | 10 2016 112 423 A1 | 1/2017 |
| FR | 3 038 642 | 1/2017 |
| JP | 2017-125339 A | 7/2017 |

OTHER PUBLICATIONS

International Search Report and Written Opinion of the ISA for PCT/EP2019/085970 dated Mar. 12, 2020, 12 pages.

* cited by examiner

US 11,955,967 B2

FLEXIBLE NON-MAGNETIC AND METALLIC TARGET FOR AN INDUCTIVE SENSOR

This application is the U.S. national phase of International Application No. PCT/EP2019/085970 filed Dec. 18, 2019 which designated the U.S. and claims priority to FR Patent Application No. 1873186 filed Dec. 18, 2018, the entire contents of each of which are hereby incorporated by reference.

BACKGROUND OF INVENTION

Field of the Invention

The present invention relates to an assembly of a non-magnetic and metallic target and its support, with the target being flexible, the assembly being intended for an inductive sensor. An inductive sensor provided with such a target can be housed in an opening element handle, in an opening element or an opening element frame of a motor vehicle with an outer shape that can be pressed in order to remotely unlock or lock the opening element, for example, using a device for detecting the presence of a user for "hands-free" type unlocking, since it does not require any manual operation of the opening element nor the user handling a fob.

Description of the Related Art

At present, the opening element handles of a vehicle are equipped with devices for detecting the presence of a user. The detection of the presence of a user, associated with the recognition of a "hands-free" electronic fob for remote controlled access, which fob is carried by this user, allows remote locking and unlocking of the opening elements of the vehicle.

Thus, when the user carrying the corresponding electronic fob that is identified by the vehicle wishes to unlock the vehicle, they approach the handle or touch the door handle of the vehicle and the opening elements of the vehicle are then automatically unlocked. By approaching or pressing on a precise point of the door handle of the vehicle, called "unlocking zone", the door (or alternatively all the opening elements) is (are) unlocked without any other action by the user.

Conversely, when the user, still carrying the necessary fob identified by the vehicle, wishes to lock their vehicle, they close the door of their vehicle and they approach or momentarily press on another precise point of the handle, called "locking zone". This movement makes it possible to lock the opening elements of the vehicle automatically.

FIG. 1a shows a section view of a detection device according to the prior art. The detection device is integrated in a handle 10 of an opening element P, with the handle 10 being framed by a first surface S1 and a second surface S2.

The detection device comprises a housing B', produced in two parts, while comprising a cover C oriented toward the second surface S2 and a base B oriented toward the first surface S1. The cover C locally comprises a protuberance, located at the top and at the center of the cover C, that defines the contact zone 50 with the handle 10.

The handle 10 also comprises a resiliently pressure-deformable or pressure-movable zone Z1 located opposite the contact zone 50 of the housing B'. The thickness e1 of the resiliently pressure-deformable or pressure-movable zone Z1 is less than the thickness e0 of the second outer surface S2 of the handle 10, located around said resiliently pressure-deformable or pressure-movable zone.

A non-magnetic metallic target 40a is able to move in the direction of the arrow A. The non-magnetic metallic target 40a is produced, for example, from aluminum or from any other non-magnetic metal.

The target 40a is an inductive sensor target comprising at least one coil 20, formed by a winding of copper wires, for example, etched on a printed circuit 80. The coil 20 is electrically connected to a capacitor, thus forming an oscillating circuit, and is also connected to means for adjusting the frequency of the oscillating circuit, to means for measuring the inductance of the coil 20 and to means for comparing between the measured inductance and a threshold inductance value.

A compressible pre-stressed element 30, advantageously made of foam, is located between the non-magnetic metallic target 40a and the coil 20.

The housing B' can also comprise, in its base B, aligned with the first part 52, a second part 53, which is a zone in abutment against the handle 10, advantageously in the form of a local overthickness of the base B of the housing B'.

The means 51 for transferring a movement from the first part 52 toward the non-magnetic metallic target 40a, by pressing on the target 40a, are in the form of two fingers 51 extending the first part 52 in the direction of the arrow A toward the non-magnetic metallic target 40a.

When the user presses on the locking zone Z1 along the arrow A, the pressure-deformable or pressure-movable zone Z1 and a first part 52, which is also resiliently pressure-deformable or pressure-movable and is in contact with the pressure-deformable or pressure-movable zone Z1 by means of the contact zone 50, deforms and generates the movement of the transfer means 51 in the direction of the arrow A. The transfer means 51 then press on the non-magnetic metallic target 40a and transfer the movement thereto.

With respect to the cover C, the thickness e3 of the thicknesses of the branches pressing on the housing B is greater than the thickness e2 of the first part 52, in order to increase the flexibility of the first part, whilst retaining a rigid cover.

The non-magnetic metallic target 40a moves in turn and compresses the compressible pre-stressed element 30. By compressing, the compressible pre-stressed element 30 approaches the non-magnetic metallic target 40a of the coil 20. When the pressing action is stopped, the final distance separating the non-magnetic metallic target 40a from the coil 20 is less than the initial distance before the pressing action, which causes the inductance of the coil 20 to vary and allows the pressing action of the user on the handle 10 to be detected and therefore allows their intention to unlock the vehicle to be confirmed.

Indeed, this movement from the initial distance to the final distance modifies the inductance of the coil 20. The variation in the inductance of said coil 20 consequently represents the pressing action of the user on the handle 10.

In this prior art shown in FIG. 1a, the flexibility of the non-magnetic metallic target 40a relative to the coil 20 is achieved by inserting the compressible pre-stressed element 30, which requires the provision of an additional part between the target 40a and the coil 20 and increases the spatial requirement of the detection device.

In addition and especially, problems with respect to the uniformity of the detection occur with different sensitivity over the entire surface of the non-magnetic metallic target 40a. Finally, the precision of the detection is dependent on the cover C that is used, and in particular on the shape and the position inside the cover C of the transfer means 51, which press on the non-magnetic metallic target 40*a* and transfer thereto the movement caused by the pressure of the finger of the user on the pressure-deformable or pressure-movable zone Z1. As a result, the non-magnetic metallic target 40*a* cannot uniformly press on the compressible pre-stressed element 30, which can distort detection.

If the detection zone Z1 is much larger than the contact zone 50, non-detections of the pressing action of a finger or of the hand of the user on the handle 10 can occur. Therefore, such a detection device is not allowed to operate with a significant detection zone Z1.

FIG. 1*b* shows a section view of a detection device according to another prior art with an element 12 that can be pushed into an opening element P or an opening element frame, with its depression by the pressure of the hand of the user being used for presence detection with a view to locking or unlocking the opening element P.

Pushing the element 12 inside the opening element P presses on a non-magnetic and metallic target 40*a* and brings it closer to the coil 20 of an inductive sensor, the housing of which is referenced 1*a*. The target 40*a* is returned to a position remote from the coil 20 when no pressure is exerted on the element 12, with the element 12 also being returned to its pre-depression position. The target 40*a* therefore performs a reciprocating movement, indicated by the arrow A1.

In this other prior art, a pressing action that is offset relative to the center of the element 12 cannot be transferred to the target 40*a*, or the target 40*a* can incorrectly deform and not come close enough to the coil 20 to allow detection.

The problem underlying the present invention is to design a target for an inductive sensor, with the target translationally moving relative to at least one coil present in the sensor, which allows the sensor to detect its movement, with this target being flexible enough so that the pressure exerted on an off-centered portion of the target is transferred to the entire target, and in particular to its central portion, so that the movement of the target is identified by the sensor.

SUMMARY OF THE INVENTION

To this end, the present invention relates to an assembly of a non-magnetic and metallic target for an inductive sensor and its support, the target being flexible under pressure and under the release of the pressure in a reciprocating movement toward and away from the support, characterized in that the target comprises a central portion surrounded by flexible fixing tabs, a first end of which is secured to the central portion and a second end of which is fixed to the support, the fixing tabs being evenly distributed around the central portion, a first portion of each fixing tab closest to the central portion being stiffer relative to a portion of the fixing tab farthest away from the central portion.

The invention involves producing an inductive sensor target with a central portion that is intended to be capable of moving opposite at least one inductive coil, as in an inductive sensor according to the prior art. Providing a plurality of flexible fixing tabs, connected to the central portion of the target and returned to an initial position when no pressure is exerted on the target, allows the target to be fixed on the support, advantageously inside the support on a module.

The fixing tabs and the central portion form abutment zones, which allow a movement of a pressure-deformable or pressure-movable element to be transferred and distributed over the target and even allows it to be amplified with respect to the central portion, the abutment zones advantageously can be located on a base of the inverted U-shape that can form each fixing tab, with each base advantageously being raised relative to the central portion, therefore closer to a pressure-deformable or pressure-movable element pressing on the target than this central portion.

Firstly, the free end of the fixing tabs is fixed to the support, which forms a leverage point. Furthermore, the fixing tabs are stiffer in the portion thereof that is close to the central portion than in the free end portion thereof. As a result, the end portions of the fixing tabs fold, while the rest of the fixing tabs do not deform and therefore transfer the collapsing movement of the end portions to the central portion by causing a lever arm effect. An off-centered pressure on the target on a fixing tab, due to the bending of the free end portion of this fixing tab, will be enhanced and will be transferred to the central portion.

This particular shape according to the present invention then allows a movement to be transferred from any pressing zone on the fixing tabs to the central portion and therefore allows a potentially very large detection zone to be provided. Furthermore, with the target being fixed at the end of the fixing tabs, this provides a lever effect that increases the movement in the central portion relative to the movement at the pressing zone. Therefore, this target allows the sensitivity to be increased of the inductive sensor for which the target is intended.

The target also fulfils a spring function, which allows the pressure-deformable or pressure-movable element to be held in a retracted position of the inductive sensor when this pressure-deformable or pressure-movable element is not pressed, for example, a pressing action of a finger of the user on a handle, an outer shape or an opening element frame of a motor vehicle when the target and the associated inductive sensor are present in order to form a device for detecting a pressing action of the user on the opening element or the opening element frame.

The metallic material of the non-magnetic target provides the target with high mechanical resistance, whilst allowing the fixing tabs to have sufficient elasticity in order to bend and follow the movement imposed on the target, whilst being mechanically resistant and whilst being automatically returned to the initial position without pressure.

Advantageously, at least one stiffening rib extends longitudinally over at least one section of the first portion. Such a rib enhances the resistance between the central portion and the fixing tab, with such a connection being stressed when the target is pressed.

In order to stiffen at least the first portion of each fixing tab closest to the central portion, the addition of a longitudinal rib is a simple and economical means for enhancing the stiffness of the first portion. Other solutions also can be implemented, such as increasing the thickness of the first portion relative to the portion farthest away or even changing the base material of the fixing tab for the same fixing tab by using a stiffer material for the first portion, but these solutions are more expensive and more difficult to implement than those providing a longitudinal rib.

Advantageously, each fixing tab has an inverted U-shape that is open toward the support, with first and second branches framing a flat base of the U-shape, the first branch having the first end secured to the central portion and the second branch having the second end fixed to the support.

An inverted U-shape enhances the transfer of pressure from a fixing tab to the central portion and the distribution of a pressure on a fixing tab over the entire target. An off-centered pressure on the target thus can also cause sufficient movement of the target to allow detection, by the inductive sensor, of a change of position.

The flat base of the U-shape provides an adequate reception surface for receiving a pressure transferred to the target, whilst being off-centered relative to the target. Even in this case, the target deforms enough to allow detection of its movement.

Advantageously, the first and second branches of each fixing tab extend away from each other, with a distance between the first and second free ends being greater than a length of the flat base of the U-shape.

Advantageously, the second free end of each fixing tab may or may not be detachably fixed to the support by an end portion that is curved relative to the rest of the second branch. This anchoring point allows a lever effect to be exerted that amplifies the movement of a pressure-deformable or pressure-movable element that is transferred to the target.

Advantageously, each curved end portion is provided with an eyelet for the passage of a means for fixing the second branch to the support. The target thus can be detached from its support, which can also contain elements of the inductive sensor, which makes it easy to dismantle the assembly. The fixing means can be a snap-fitting means, a rivet, a screw or a fixing rod or any other fixing means, such as soldering or gluing.

Advantageously, the support has an internal flat face for receiving the target, the central portion of the target being circular and flat and being located in a plane parallel to the reception face of the support, the bases of the fixing tabs extending in a direction radial to the central portion in the plane of or a plane superimposed on the central flat portion. This allows balanced transfer of the pressure on a pressure-deformable or pressure-movable element to the target.

The invention also relates to an inductive sensor with a target, the inductive sensor comprising at least one coil, the target being translationally movable in a reciprocating movement relative to said at least one coil, characterized in that the target forms part of such an assembly, the support forming a housing for the inductive sensor by integrating said at least one coil in the interior thereof and a printed circuit board in the interior thereof.

The support thus houses the target, but also the rest of the inductive sensor. This allows even detection sensitivity to be provided over a large surface for the inductive sensor by using only a single coil, hence a single measurement and therefore a saving in terms of space, consumption and response time.

Advantageously, the target is at least partially housed in the support having a through-opening for the passage of the target, the through-opening being closed by an additional part in abutment against the support. This allows a support to be obtained that forms a sealed container for the sensor, with the additional part closing the opening and producing a closed chamber for the sensor.

Finally, the invention relates to an opening element or a frame of an opening element of a motor vehicle integrating a device for detecting the intention to lock or unlock an opening element of a motor vehicle by a user, the opening element or the opening element frame supporting at least one resiliently pressure-deformable or pressure-movable element positioned on an outer face of the opening element or of the frame relative to the motor vehicle, the device being formed by a housing containing a voltage source and an inductive sensor with a non-magnetic metallic target, with a variation in the position of the target occurring under a pressure of a hand of the user on said at least one resiliently pressure-deformable or pressure-movable element, characterized in that the sensor with a target is a sensor as previously described, the target being configured to the dimensions of said at least one pressure-deformable or pressure-movable element, said at least one pressure-deformable or pressure-movable element comprising fingers passing through the opening element or the opening element frame, with at least one finger pointing toward and in abutment on the central portion and one finger pointing toward and in abutment on each fixing tab, the fingers transferring the pressure from the user to the target, which is then moved into position toward the coil.

In the first previously described prior art, the pressure zone of the finger of the user is necessarily reduced and must be opposite a pressure-deformable and pressure-movable element contained inside the handle of the opening element. Conversely, the present invention allows a larger pressure zone for the finger to be provided on the opening element or the opening element frame, since the target according to the present invention is able to move under the action of a pressure that is off-centered relative to the target.

The second prior art made provision for providing a significant opening in the opening element or the opening element frame, which was highly disadvantageous with respect to the seal inside the opening element or the opening element frame. The present invention can allow only small recesses to be provided for the passage of an element, advantageously in the form of a finger, for pressing on the target through the opening element and the opening element frame. A finger refers to a pressing element and not to a finger of the user.

At least one finger presses on the central portion, with the other fingers respectively being associated with a fixing tab. Thus, the movement of one or more large pressure-deformable or pressure-movable elements can be transferred to the target, even if the pressure of a hand of the user on the pressure-deformable or pressure-movable element is off-centered.

Incidentally, such a target allows the use of a compressible pre-stressed element, as provided in the prior art, in the inductive sensor to be avoided, which reduces the spatial requirement of the inductive sensor and therefore of the device for detecting the intention to lock or unlock in a handle or a frame, in which the available space is necessarily reduced.

Advantageously, said at least one pressure-deformable or pressure-movable element is a logo specific to the type of motor vehicle. This logo can be placed, for example, on a trunk of a motor vehicle and acts as a pressure button for detecting an intention to lock or unlock an opening element of a motor vehicle.

Advantageously, the fingers pass through the additional part through respective perforations, conforming to the size of the associated finger, with an insulating foam being deposited between a face of the additional part opposite said at least one pressure-deformable or pressure-movable element and a portion of the inner face of said at least one pressure-deformable or pressure-movable element.

BRIEF DESCRIPTION OF THE DRAWINGS

Further features, aims and advantages of the present invention will become apparent from reading the following detailed description, and with reference to the accompanying drawings, which are provided by way of non-limiting examples, and in which.

DESCRIPTION OF THE PREFERRED EMBODIMENTS

Figure 1A:
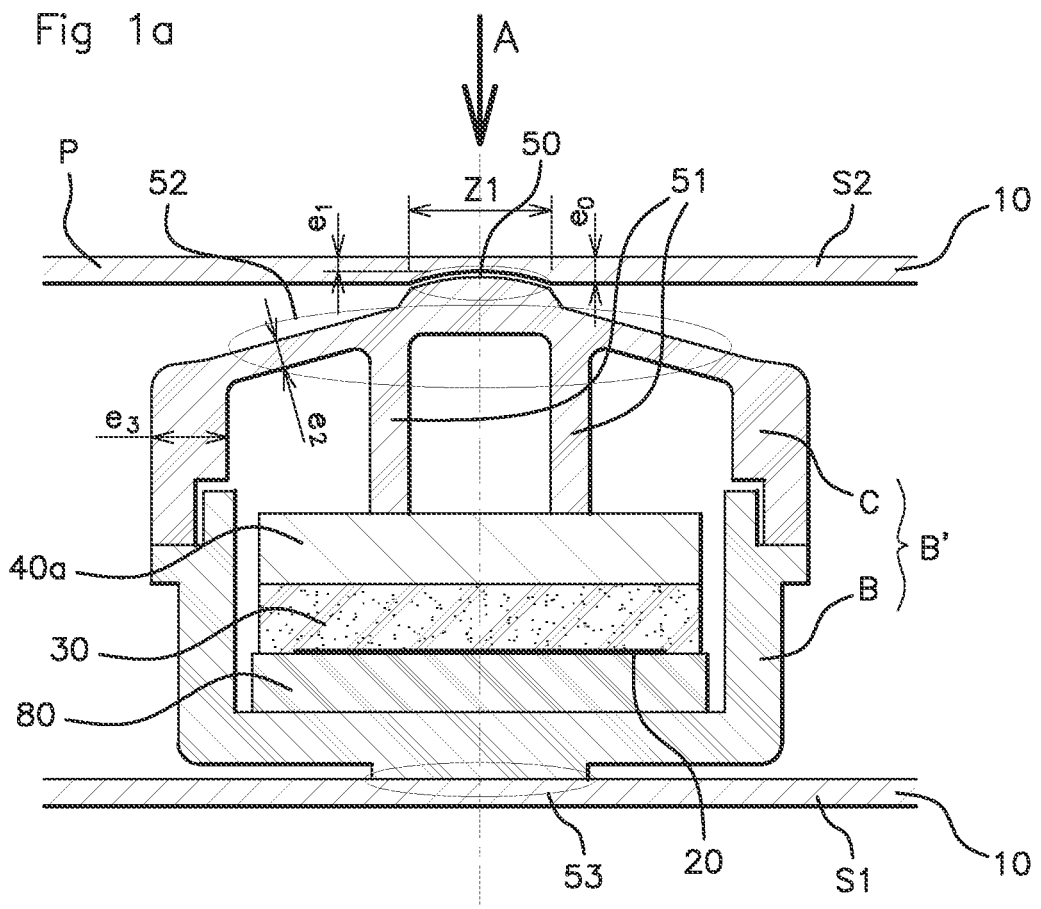
FIG. 1a is a schematic representation of a section view of an opening element handle of a motor vehicle comprising a device for detecting a pressing action of a user on the handle for unlocking or locking the opening element, with the handle being a handle according to a first prior art.

In the following description, in FIGS. 2 to 5, a single fixing tab is referenced 4; furthermore, the constituent elements of a fixing tab are only referenced once per figure. The same applies for only one of the snap-fitting elements, referenced 7a, of the opening element 7 of the support 1 and only one of the housings 8b for one of the snap-fitting elements 7a in the additional part 8. However, the statement for one of these referenced components is valid for all the other components of the same type.

Figure 1B:
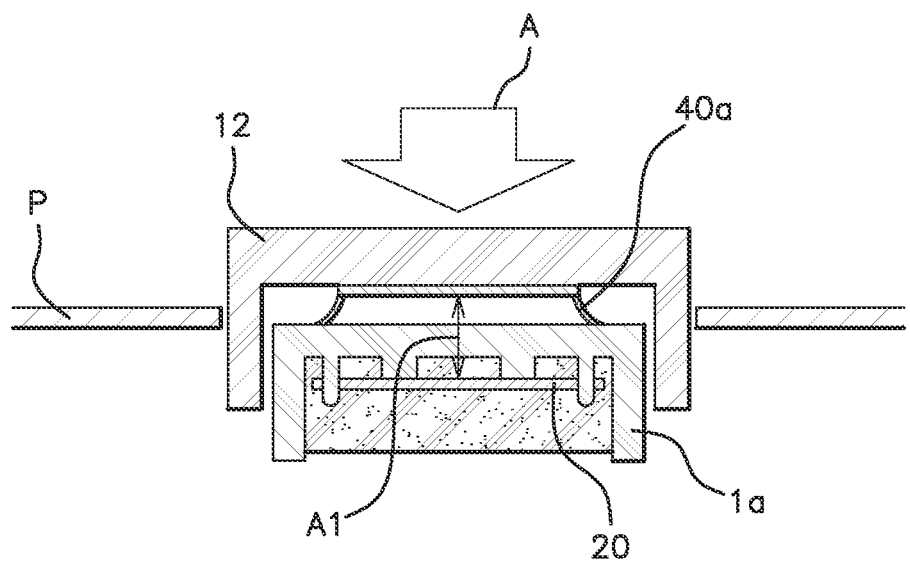
FIG. 1b is a schematic representation of a section view of an opening element or of an opening element frame of a motor vehicle comprising an element projecting from the opening element and that can move by being pushed into the opening element or the frame for detecting a pressing action of a user on the handle for unlocking or locking the opening element, according to a second prior art.

FIGS. 1a and 1b have already been described in the introductory section of the present application. FIG. 1a shows a first prior art of an inductive sensor with a single coil 20. It should be borne in mind that the target of the present invention is not only intended for such an inductive sensor with a single coil 20, but can, for example, be used with a sensor comprising a main coil and at least two secondary coils, in particular intertwined coils. Similarly, the translation movement of the target 40 relative to the coil 20 or to the coils can differ to that shown in FIG. 1a.

It should also be borne in mind that the target according to the invention can be used both in an opening element handle and in cooperation with a component supported by the opening element or the opening element frame and that can implement a pushing movement in the opening element or the frame in order to push on the target.

Figure 5:
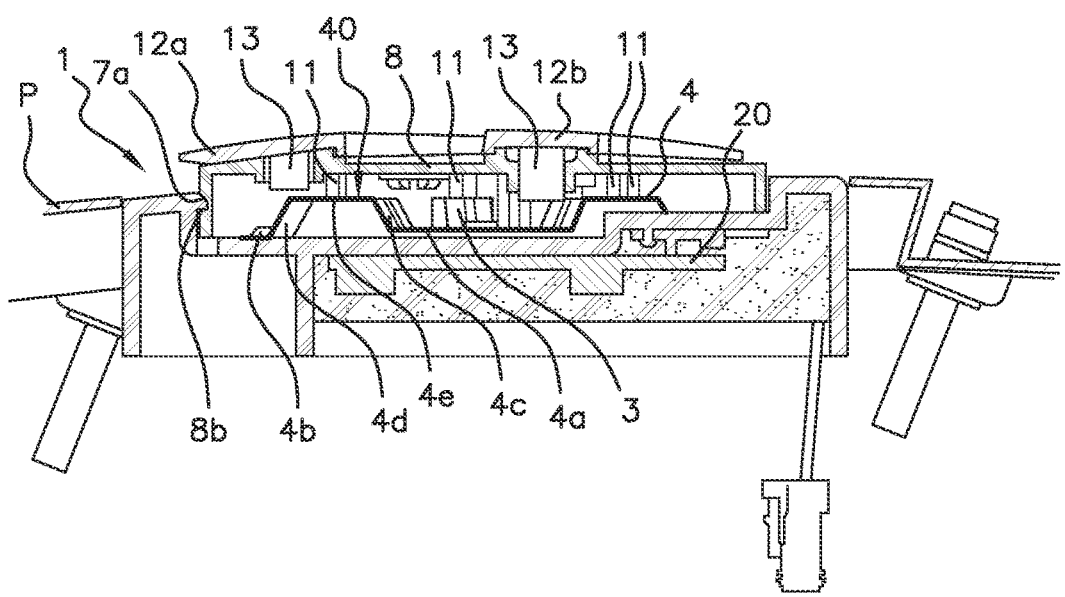
FIG. 5 is a section view of an opening element or of an opening element frame of a motor vehicle comprising an element projecting from the opening element and that can move by depression for detecting a pressing action of a user on the opening element or the frame for unlocking or locking the opening element, with the target associated with the sensor of the device for detecting a pressing action being a target according to the present invention.

Thus, in FIG. 1b, according to another prior art closer to the present invention, a deformable element 12 is shown that can deform and be pushed into an opening element P or an opening element P frame. It is in this case that the use of the target 40a according to the present invention has the greatest advantages. FIG. 5 will be compared to FIG. 1b in order to better understand the advantages provided by the present invention.

With particular reference to FIGS. 2 to 5, whilst referring to FIGS. 1a and 1b for the references missing from FIGS. 2 to 5, the present invention relates to an assembly of a metallic and non-magnetic target 40 for an inductive sensor and its support 1. This target 40 is flexible under pressure and under the release of the pressure in a reciprocating movement toward and away from the support 1, in order to be able to move relative to at least one coil 20 forming part of an inductive sensor, this one or more coil(s) 20 can be integrated in the support 1.

Figure 2:
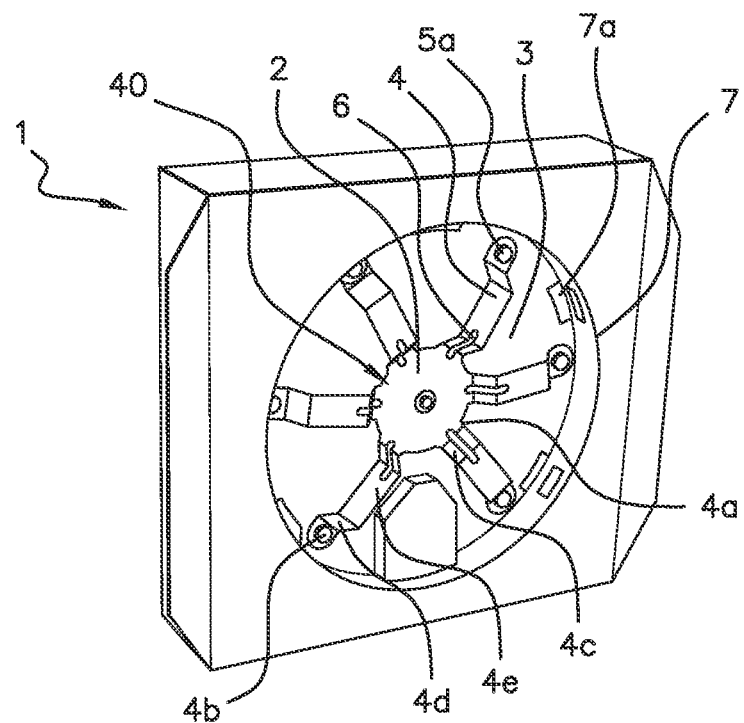
FIG. 2 is a schematic representation of a perspective view of a flexible inductive sensor target and its support according to one embodiment of the present invention.
Figure 3:
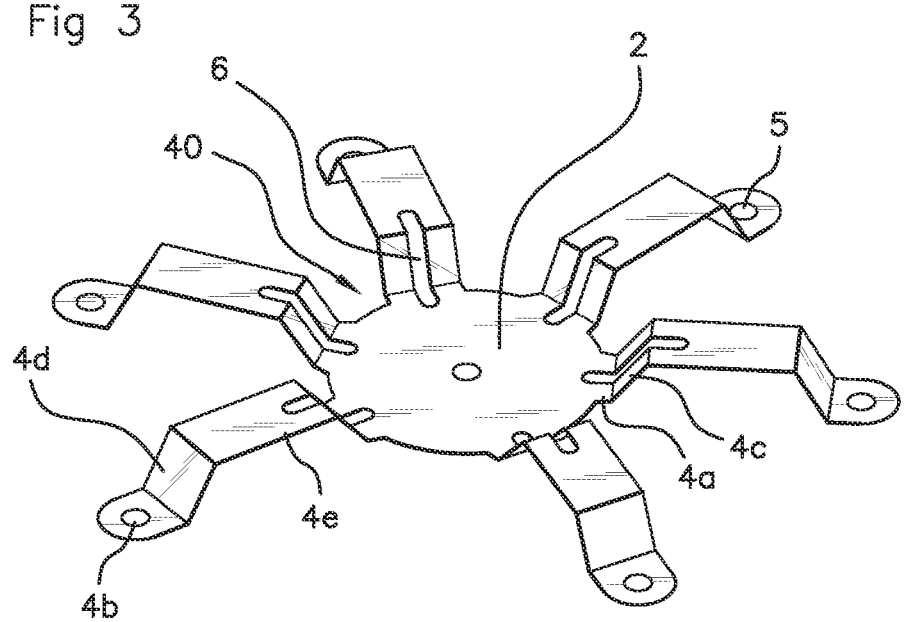
FIG. 3 is a schematic representation of a perspective view of a flexible inductive sensor target according to one embodiment of the present invention, with the target being in the form of an octopus with a central portion surrounded by flexible fixing tabs.

With more particular reference to FIGS. 2 and 3, the target 40 comprises a central portion 2 surrounded by flexible fixing tabs 4, a first end 4a of which is secured to the central portion 2 and a second end 4b of which is fixed to the support 1. A first portion 4c of each fixing tab 4 closest to the central portion 2 is stiffer relative to a portion 4d farthest away from the central portion 2.

Such stiffening of the first portion 4c closest to the central portion 2 can be implemented by various means taken individually or in combination, including the presence of longitudinal ribs 6 on at least one section of the first portion 4c, an increase in the thickness or the width of the first portion 4c relative to the portion. The stiffening ribs can partially overlap onto the central portion 2, in particular at the junction of the central portion 2 with the first portion 4c.

Without being limiting, in FIGS. 2 and 3, the target 40 comprises six fixing tabs 4. These fixing tabs 4 are evenly distributed around the central portion 2. As is more clearly shown in FIG. 3, each fixing tab 4 can have an inverted U-shape that is open toward the support 1, with first and second branches 4c, 4d framing a flat base 4e of the U-shape. The first branch 4c can have the first end 4a secured to the central portion 2 and the second branch 4d can have the second end 4b fixed to the support 1.

In this configuration, the first stiffened portion at least partially can be the first branch 4c and the flat base 4e of the U-shape, with a stiffening rib 6 extending at least over the adjacent parts of the first branch 4c and of the flat base 4e, with the less stiff portion being the second branch 4d. The stiffening rib 6 of each fixing tab 4 also can project over the part adjacent to each fixing tab 4 of the central portion 2 of the target 40.

With the anchoring point on the support 1 at the end of the second branch 4d that is more flexible than the rest of the fixing tab 4, pressing on the flat base 4e of a fixing tab 4 will bend the second branch 4d, whereas the flat base 4e will remain rigid, as will the first branch 4c for transferring the bending to the central portion 2 of the target 40. The other fixing tabs not affected by the pressing action will help to suitably position the central portion 2 by inflection.

The first and second branches 4c, 4d of each fixing tab 4 can extend by moving away from each other, with a distance between the first and second ends 4a, 4b being greater than a length of the flat base 4e of the U-shape. The first and second branches 4c, 4d and the base 4e of the U-shape can be in the form of flexible flat strips. The fixing tabs 4 can be made of the same material as the central portion 2 of the target 40 and may or may not be produced as a single piece with this central portion 2.

The flat base 4e of the U-shape can be raised relative to the central portion 2 or can be in the same plane. The central portion 2 can be flat or slightly domed by being of convex shape, curving opposite the support 1 or the free ends of the fixing tabs 4. This is not necessarily the case.

The second end 4b of each fixing tab 4, therefore of the second branch 4d, may or may not be detachably fixed to the support 1 by an end portion that is curved relative to the rest of the second branch 4d. The curvature of this end portion, which can form with the rest of the second branch 4d an angle close to 90° able to be greater than 90°, also helps to retain the second branch 4d relative to the support 1 and to the lever effect procured by fixing the second end 4b against the support 1.

Each curved end portion can be provided with an eyelet 5, shown in FIG. 3, for the passage of a means 5a for fixing the second branch 4d to the support 1, said fixing means 5a being of the screw, threaded rod, rivet, snap-fitting means, solder, glue or other type and being shown in FIG. 2.

FIG. 3 shows three pressing points at each curved end portion. Similarly, the flat base 4e of the U-shape of one of the fixing tabs 4 shows descending arrows showing the pressing action applied to this base 4e, which will mainly bend the second branch 4d, then the central portion 2 of the target 40.

Figure 4:
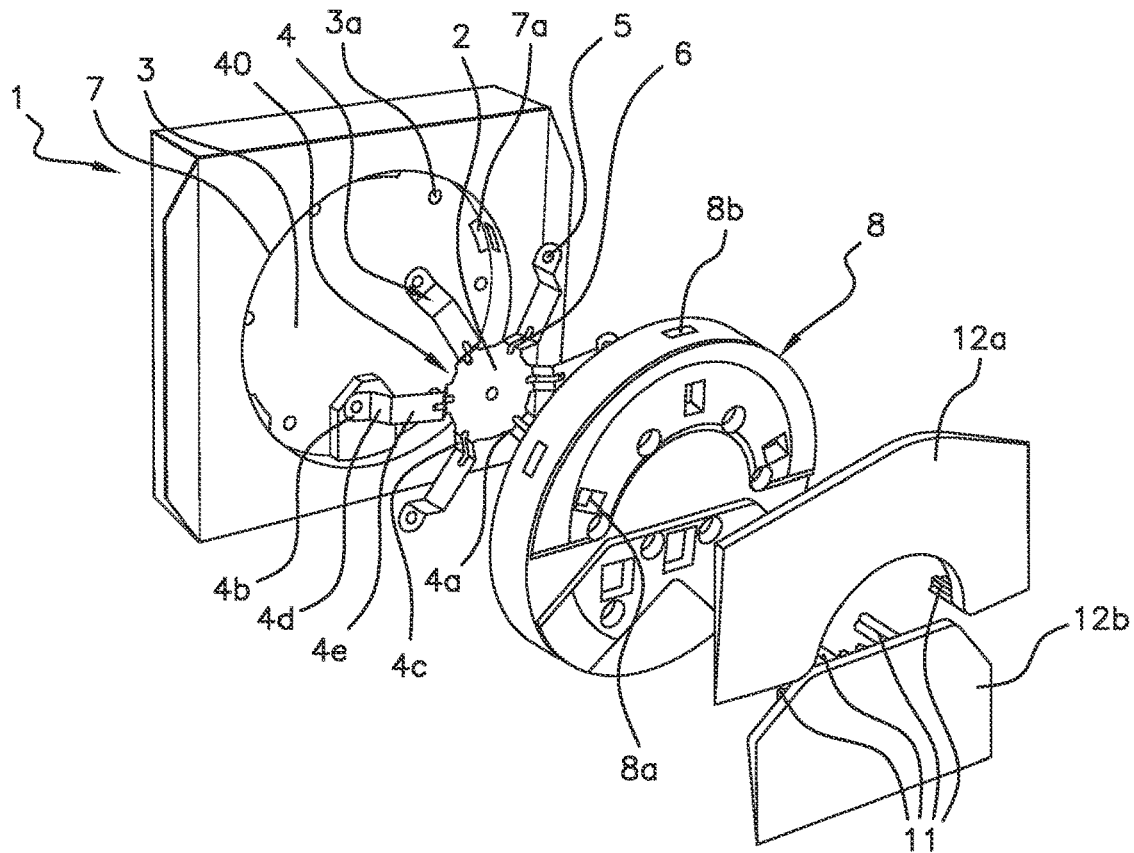
FIG. 4 is a schematic representation of an exploded perspective view of the assembly of a flexible inductive sensor target and its support, with an additional part for closing the support and a pressure component provided with means for pressing on the target passing through the additional part.

As shown in FIGS. 2 and 4, the support 1 can be in the form of a rectangular parallelepiped having a central opening 7 on one of its widest faces for the at least partial insertion of the target 40 therein. Therefore, the support 1 can have an internal module or flat reception face 3 for the target 40, with the target 40 being secured on said module or face 3.

The module 3 has bores 3a for receiving means 5a for fixing between the target 40 and the support 1, for example, internally threaded bores for screws or threaded rods as fixing means or housings for snap-fitting means passing through the eyelet 5 of each fixing tab 4.

In the raised position of the target 40 in the support 1, the central portion 2 of the target 40, which advantageously is in the form of a flat or slightly domed, convex shaped disk opposite the fixing tabs 4, can be located in a plane parallel to the reception face of the support 1. The bases 4e of the fixing tabs 4 can extend in a direction radial to the central portion 2, advantageously in the plane of or in a plane superimposed on the central flat portion 2.

As previously stated, the central portion 2 and the fixing tabs 4 may or may not be produced in one piece. In both cases, at least one stiffening rib 6 can extend longitudinally over at least one section of the first branch 4c, over one section of the central portion 2 adjacent to the first free end 4a and, where applicable, over one section of the base 4e of each fixing tab 4.

For example, FIG. 4 shows, for each fixing tab 4, that the stiffening ribs 6 extend longitudinally over the entire length of the first branch 4c and project over the part adjacent to the first branch 4c of the central portion 2 and over the part adjacent to the first branch 4c of the base 4e.

With more particular reference to FIGS. 4 and 5, the invention also relates to an inductive sensor with a target 40, with the inductive sensor comprising at least one coil 20, the target 40 being translationally movable in a reciprocating movement relative to said at least one coil 20. The target 40 forms part of a target 40 and a support 1 assembly as previously described. In this case, the support 1 forms a housing of the inductive sensor by integrating said at least one coil 20 therein. There can be a single coil 20 or a primary coil and one or two secondary coils.

In a preferred embodiment of the present invention, the target 40 can be at least partially housed in the support 1 having a through-opening 7 for the passage of the target 40. This through-opening 7 can be closed by an additional part 8 in abutment against the support 1.

A face of the additional part 8 opposite the support 1 is intended to be at least partially covered by a pressure component 12a, 12b provided with means 11 for pressing on the target 40 passing through said face of the additional part 8 via perforations 8a, only one of which is referenced.

In the embodiment shown in FIG. 5, the pressure component 12a, 12b is a deformable or movable element, with this element being positioned on an outer face of an opening element P or an opening element frame, which is preferred but is non-limiting within the scope of the present invention.

The pressing means 11 can be similar to the transfer means 51 shown in FIG. 1a in the form of fingers pointing toward the target 40. These pressing means 11 are partially shown in FIGS. 4 and 5.

The additional part 8 can be in the form of a disk, the diameter of which corresponds to the diameter of the opening 7 of the support 1. The section of the disk formed by the additional part 8 can support housings 8b, in each of which a respective snap-fitting means 7a supported by the profile of the opening 7 of the support enters in order to secure the additional part 8 in the opening 7 of the support 1.

With more particular reference to FIG. 5, the present invention relates to an opening element P or an opening element P frame of a motor vehicle integrating a device for detecting the intention to lock or unlock an opening element P of a motor vehicle by a user.

The opening element P or the opening element P frame have at least one resiliently pressure-deformable or pressure-movable element 12a, 12b positioned on an outer face of the opening element P or of the frame relative to the motor vehicle.

The device for detecting the intention to lock or unlock an opening element P or of an opening element frame of a motor vehicle by a user is formed by a housing 1 containing a voltage source and an inductive sensor with a non-magnetic metallic target 40, with a variation in the position of the target 40 occurring under the pressure of a hand of the user on said at least one resiliently pressure-deformable or pressure-movable element 12a, 12b.

This sensor with a target 40 is a sensor as previously described, with the housing 1 being formed by the support associated with the target 40. The target 40 is configured to the dimensions of said at least one pressure-deformable or pressure-movable element 12a, 12b for optimal transfer of the depression or of the deformation of the element 12a, 12b toward the target 40.

The pressure-deformable or pressure-movable element 12a, 12b, in two parts in FIGS. 4 and 5, but with this being by no means essential within the scope of the present invention, comprises fingers 11 as transfer elements passing through the opening element P or the opening element P frame via a respective through-recess conforming to the size of the finger 11 or via a common opening produced in the opening element P or the opening element P frame.

For all the fingers 11, at least one finger 11, and advantageously two fingers, point toward and are in abutment on the central portion 2, and a respective finger 11 points toward and is in abutment on each fixing tab 4. The fingers 11 transfer the pressure of the user exerted on said at least one pressure-deformable or pressure-movable element 12a, 12b to the target 40, which is then moved into position toward the coil 20.

Snap-fitting means 13 can exist that are supported by the pressure-deformable element or by each pressure-deformable or pressure-movable element 12a, 12b engaging with matching snap-fitting means supported by the additional part 8 in order to retain the element or each element 12a, 12b relative to the additional part 8, which itself is fixed to the support 1.

This can be necessary, especially since said at least one pressure-deformable or pressure-movable element 12a, 12b is a logo specific to the type of motor vehicle and is therefore susceptible to being removed through vandalism. As is particularly clearly shown in FIG. 4 as an exploded view, the fingers 11 can pass through the additional part 8 via respective perforations 8a, each conforming to the size of the associated finger 11. As it is not shown in the figures, an insulating foam can be deposited between a face of the additional part 8 opposite the opening element P or the opening element P frame and a portion of the inner face of the opening element P or of the opening element P frame can have recesses for the passage of the fingers 11 in order to provide a seal against the outside environment.

The invention claimed is:

1. An assembly comprising:
 a non-magnetic and metallic target for an inductive sensor and support, the non-magnetic and metallic target being flexible under pressure and under the release of the pressure in a reciprocating movement toward and away from the support, the non-magnetic and metallic target comprising
  a central portion surrounded by flexible fixing tabs, a first end of each of the respective flexible fixing tabs being secured to the central portion and a second end of each of the respective flexible fixing tabs fixed to the support, the fixing tabs being evenly distributed around the central portion, a first portion of each fixing tab closest to the central portion being stiffer relative to a second portion of the fixing tab farthest away from the central portion, each fixing tab having an inverted U-shape that is open toward the support with a first branch extending from the central portion, a flat base of the U-shape extending from the first branch, and a second branch extending from the flat base of the U-shape.

2. The assembly as claimed in claim 1, wherein at least one stiffening rib extends longitudinally over at least one section of the first portion.

3. The assembly as claimed in claim 2, wherein the first branch has the first end secured to the central portion and the second branch has the second end fixed to the support.

4. An inductive sensor with a target, the inductive sensor comprising:
 at least one coil, the target being translationally movable in a reciprocating movement relative to said at least one coil,
 wherein the target forms part of the assembly as claimed in claim 2, the support forming a housing for the inductive sensor by integrating said at least one coil and a printed circuit board in the interior thereof.

5. The assembly as claim 1, wherein the first branch has the first end secured to the central portion and the second branch has the second end fixed to the support.

6. The assembly as claimed in claim 5, wherein the first and second branches of each fixing tab extend away from each other, with a distance between the first free end and the second free end being greater than a length of the flat base of the U-shape.

7. The assembly as claimed in claim 6, wherein the second end of each fixing tab is configured to be detachably fixed to the support by an end portion that is curved relative to the rest of the second branch.

8. The assembly as claimed in claim 6, wherein the support has an internal flat face configured to receive the target, the central portion of the target being circular and flat and being located in a plane parallel to the reception face of the support, the bases of the fixing tabs extending in a direction radial to the central portion in the plane of or a plane superimposed on the central flat portion.

9. An inductive sensor with a target, the inductive sensor comprising:
 at least one coil, the target being translationally movable in a reciprocating movement relative to said at least one coil,
 wherein the target forms part of the assembly as claimed in claim 6, the support forming a housing for the inductive sensor by integrating said at least one coil and a printed circuit board in the interior thereof.

10. The assembly as claimed in claim 5, wherein the second end of each fixing tab is fixed to the support by an end portion that is curved relative to the rest of the second branch.

11. The assembly as claimed in claim 10, wherein each curved end portion is provided with an eyelet for the passage of a fixing system configured to fix the second branch to the support.

12. The assembly as claimed in claim 11, wherein the support has an internal flat face configured to receive the target, the central portion of the target being circular and flat and being located in a plane parallel to the reception face of the support, the bases of the fixing tabs extending in a direction radial to the central portion in the plane of or a plane superimposed on the central flat portion.

13. The assembly as claimed in claim 10, wherein the support has an internal flat face configured to receive the target, the central portion of the target being circular and flat and being located in a plane parallel to the reception face of the support, the bases of the fixing tabs extending in a direction radial to the central portion in the plane of or a plane superimposed on the central flat portion.

14. The assembly as claimed in claim 10, wherein the second end of each fixing tab is configured to be detachably fixed to the support by said end portion that is curved relative to the rest of the second branch.

15. The assembly as claimed in claim 5, wherein the support has an internal flat face configured to receive the target, the central portion of the target being circular and flat and being located in a plane parallel to the reception face of the support, the bases of the fixing tabs extending in a direction radial to the central portion in the plane of or a plane superimposed on the central flat portion.

16. An inductive sensor with a target, the inductive sensor comprising:
 at least one coil, the target being translationally movable in a reciprocating movement relative to said at least one coil,
 wherein the target forms part of the assembly as claimed in claim 5, the support forming a housing for the inductive sensor by integrating said at least one coil and a printed circuit board in the interior thereof.

17. An inductive sensor with a target, the inductive sensor comprising:
 at least one coil, the target being translationally movable in a reciprocating movement relative to said at least one coil,
 wherein the target forms part of the assembly as claimed in claim 1, the support forming a housing for the inductive sensor by integrating said at least one coil and a printed circuit board in the interior thereof.

18. The inductive sensor as claimed in claim 17, wherein the target is at least partially housed in the support having a through-opening for the passage of the target, the through-opening being closed by an additional part in abutment against the support.

19. An opening element or frame of an opening element of a motor vehicle integrating a detection device configured to detect an intention to lock or unlock the opening element of the motor vehicle by a user,
wherein the opening element or the opening element frame supports at least one resiliently pressure-deformable or pressure-movable element positioned on an outer face of the opening element or of the frame relative to the motor vehicle,
the detection device is formed by a housing containing a voltage source and an inductive sensor with a non-magnetic and metallic target that is flexible under pressure and under the release of the pressure in a reciprocating movement toward and away from a support, the non-magnetic and metallic target including a central portion surrounded by flexible fixing tabs, a first end of each of the respective flexible fixing tabs being secured to the central portion and a second end of each of the respective flexible fixing tabs fixed to the support, the fixing tabs being evenly distributed around the central portion, a first portion of each fixing tab closest to the central portion being stiffer relative to a second portion of the fixing tab farthest away from the central portion, each fixing tab having an inverted U-shape that is open toward the support with first and second branches framing a flat base of the U-shape, the inductive sensor including at least one coil, the target being translationally movable in a reciprocating movement relative to said at least one coil, the support forming the housing for the inductive sensor by integrating said at least one coil and a printed circuit board in the interior thereof, the target being at least partially housed in the support having a through-opening for the passage of the target, the through-opening being closed by an additional part in abutment against the support, a variation in the position of the target occurring under the pressure of a hand of the user on said at least one resiliently pressure-deformable or pressure-movable element, the target being configured to the dimensions of said at least one pressure-deformable or pressure-movable element, said at least one pressure-deformable or pressure-movable element comprising fingers passing through the opening element or the opening element frame, at least one finger pointing toward and in abutment on the central portion and one finger pointing toward and in abutment on each fixing tab, the fingers transferring the pressure from the user to the target, which is then moved into position toward the coil.

20. The opening element or frame of the opening element as claimed in claim 19, wherein said at least one pressure-deformable or pressure-movable element is a logo specific to the type of motor vehicle.

21. The opening element or frame of the opening element as claimed in claim 19, wherein the fingers pass through the additional part through respective perforations, each conforming to the size of the associated finger, an insulating foam being deposited between a face of the additional part opposite said at least one pressure-deformable or pressure-movable element and a portion of the inner face of said at least one pressure-deformable or pressure-movable element.

* * * * *